United States Patent [19]

Fossel

[11] Patent Number: 4,912,050
[45] Date of Patent: Mar. 27, 1990

[54] PROCESS FOR THE SCREENING OF CANCER USING NUCLEAR MAGNETIC RESONANCE

[75] Inventor: Eric T. Fossel, Chestnut Hill, Mass.

[73] Assignee: The Beth Israel Hospital Association, Boston, Mass.

[21] Appl. No.: 303,586

[22] Filed: Jan. 27, 1989

Related U.S. Application Data

[63] Continuation of Ser. No. 833,840, Feb. 26, 1986, abandoned.

[51] Int. Cl.$^4$ .............................................. G01N 33/48
[52] U.S. Cl. ........................................ 436/64; 436/71; 436/173; 324/300; 324/307; 324/309; 128/653 A
[58] Field of Search ........................... 436/64, 71, 173; 324/300, 307, 309; 128/653

[56] References Cited

U.S. PATENT DOCUMENTS

| | | | |
|---|---|---|---|
| 3,420,634 | 1/1969 | Godsey | 436/173 X |
| 3,789,832 | 2/1974 | Damadian | 128/653 |
| 4,115,002 | 9/1978 | Morre et al. | 436/64 |
| 4,354,499 | 10/1982 | Damadian | 128/653 |
| 4,390,633 | 6/1983 | Merilan et al. | 436/173 X |
| 4,411,270 | 10/1983 | Damadian | 128/653 |
| 4,521,733 | 6/1985 | Bottomley et al. | 324/309 |
| 4,608,991 | 9/1986 | Rollwitz | 128/653 |

OTHER PUBLICATIONS

Mountford et al., *Biochem. Biophys. Acta*, 720, (1982) pp. 65-74.
Chamberlain, *The Practice of NMR Spectroscopy*, Plenum Press (N.Y.), 1974, pp. 13-14.
Ohsaka et al., *Japan. J. Med. Sci. Biol.*, 32, pp. 305-309; 1979.
Mountford et al., *Br. J. Cancer* (1980) 41, pp. 1000-1003.
Mountford et al., *Science*, vol. 226, (1984), pp. 1415-1417.
Floyd et al, *Cancer Research*, vol. 34, pp. 89-91, Jan. 1974.
Hazlewood et al, *J. of Nat'l. Cancer Inst.*, vol. 52, No. 6, pp. 1849-1853, Jun. 1974.
McLachlan, *Phys. Med. Biol.*, vol. 25, No. 2, pp. 309-315, 1980.
Smith et al, *Radiology*, vol. 142, pp. 677-680, Mar. 1982.
Klimek et al, *Ginekol Pol.*, vol. 52, No. 6, pp. 493-502, 1981.
Beall et al, *NMR Basic Principles and Progress*, vol. 19, pp. 39-57, 1981.
Wieczorek et al, *Proc. Nat'l. Acad. Sci. U.S.A.*, vol. 82, pp. 3455-3459, May 1985.
Mountford et al, *J. of Biochem. and Biophys. Meth.*, vol. 9, pp. 323-330, 1984.

*Primary Examiner*—Barry S. Richman
*Assistant Examiner*—Lynn M. Kummert
*Attorney, Agent, or Firm*—Lorusso & Loud

[57] ABSTRACT

A technique is disclosed for the detection of cancer using nuclear magnetic resonance (NMR). Specifically, NMR parameters for protons of lipid methyl and/or methylene groups are determined and compared against a corresponding value for healthy patients. In the preferred embodiments, an NMR spectrometer is employed in conjunction with a Fourier transformer to provide a spectrum for non-water components of blood, blood serum or blood plasma and the width of the methyl and/or methylene groups is measured at half-height as a determination of spin-spin relaxation time ($T_2$) which is the parameter used for purposes of comparison with healthy controls. Suppression of the water proton signal is employed where necessary in order to obtain a suitable spectrum for the non-water component protons.

27 Claims, 4 Drawing Sheets

PROCESS FOR THE SCREENING OF CANCER USING NUCLEAR MAGNETIC RESONANCE

This is a continuation of co-pending application Ser. No. 833,840 filed on Feb. 26, 1986, now abandoned.

BACKGROUND OF THE INVENTION

1. Field of the Invention

The present invention relates to a diagnostic method and apparatus for the detection of cancer in a living patient.

2. Prior Art

Attempts utilize the technique of nuclear magnetic resonance (NMR) to aid in arriving at a clinical diagnosis of cancer are well known in the prior art.

Damadian was the first to propose any medical use for nuclear magnetic resonance (NMR) and that was for the detection of malignancy. See R. Damadian, "Tumor Detection by Nuclear Magnetic Resonance," *Science* 171:1151–1153 (1971). U.S. Pat. No. 3,789,832 issued to Damadian covering an apparatus and method for application of nuclear magnetic resonance to surgically removed specimens to measure $T_1$ and $T_2$ for proton relaxation times, which values compared against values for healthy tissue were taken as an indication of cancer. U.S. Pat. Nos. 4,411,270 and 4,354,499 issued to Damadian cover apparatus and method for cancer detection with NMR imaging and scanning of whole-body specimens.

A number of other investigators also reported that nuclear magnetic resonance relaxation times ($T_1$) for water protons in organs of tumor-bearing animals have higher values than the corresponding $T_1$ for water structure in organs of healthy animals. See Frey et al, *J. Natl. Cancer Inst.* 49, 903 (1972); Inch et al, *J. Natl. Cancer Inst.* 52, 353 (1974); Iijima et al, *Physiol. Chem. and Physics* 5, 431 (1973); and Hazlewood et al, *J. Natl. Cancer Inst.* 52, 1849 (1974).

Today, despite uncertainty regarding mechanistic details, it is well known that biophysical changes which occur in malignant cells often result in alterations of the proton NMR signal. See D. G. Taylor et al, "A Review of the Magnetic Resonance Response of Biological Tissue and Its Applicability to the Diagnosis of Cancer by NMR Radiology," *Computed Tomography*, 5:122–133 (1981). Such changes from the physical basis for detection of tumors by proton NMR imaging. See R. Zimmerman et al, "Cerebral NMR: Diagnostic Evaluation of Brain Tumors by Partial Saturation Technique with Resistive NMR," *Neuroradiology* 27:9–15 (1985) and K. Ohtomo, "Hepatic Tumors: Differentiation by Transverse Relaxation Time ($T_2$) of Magnetic Resonance Imaging," *Radiology* 155:421–423 (1985). However, NMR imaging is not likely to be widely applied as a screening test for malignancy because of accessibility and economic factors.

Proton NMR studies on excised tumors, as well as on plasma and serum, from experimental animals and patients have often shown differences in the relaxation parameters $T_1$, $T_2$ and $T_2^*$ as a function of malignancy. Such findings have been reported by the following:

L. McLachlan, "Cancer-induced Decreases in Human Plasma Proton NMR Relaxation Rates," *Phys. Med. Biol.* 25:309–315 (1980);

F. Smith et al, "Nuclear Magnetic Resonance Imaging of the Pancreas," *Radiology* 142:677–680 (1982);

P. Beall et al, "The Systemic Effect of Elevated Tissue and Serum Relaxation Times for Water in Animals and Humans with Cancers," *NMR Basic Principles and Progress*, P. Diehl et al, Eds., 19:39–57 (1981);

R. Floyd, "Time Course of Tissue Water Proton Spin-lattice Relaxation in Mice Developing Ascites Tumor," *Cancer Res.* 34:89–91 (1974);

C. Hazelwood et al, "Relationship Between Hydration and Proton Nuclear Magnetic Resonance Relaxation Times in Tissues of Tumor Bearing and Nontumor Bearing Mice: Implications for Cancer Detection," *J. Natl. Cancer Inst.* 52:1849–1853 (1974); and R. Klimek et al, "A Discussion of Nuclear Magnetic Resonance (NMR) Relaxation Time of Tumors in Terms of Their Interpretation as Self-organizing Dissipative Structures, and of Their Study by NMR Zeugmatographic Imaging," *Ginekol Pol.* 52:493–502 (1981). However, due to extensive overlap of groups and small differences between the means of groups, these methodologies are not clinically useful.

While most of the prior art mentioned above describes applications of NMR to analysis of tissue, it is also known to subject body fluids to such analysis. This is described, for example, by Beall et al., supra.

The foregoing prior art studies and methods, as well as all other prior art NMR methods for the detection of malignancy, rely on the observation of the composite NMR signal arising from all protons in the tissue or blood derived samples. This composite signal is dominated by the protons of water, obscuring the NMR signal from other proton-containing constituents of the sample. Indeed, the prior art believed that the apparent correlation between malignancy and observed changes in NMR parameters was due to "changes in water structure" quoting Frey et al., supra.

In other applications of proton NMR spectroscopy, it was known to suppress the signal from the solvent (such as water) in a sample.

At present, a reliable and statistically unequivocal NMR method of diagnosing the presence of cancer in a living patient has not been developed.

SUMMARY OF THE INVENTION

Accordingly, one object of the invention is to provide a method of and apparatus for diagnosing the presence of cancer in a living patient.

Yet another object is to provide such a method which can be carried out on a sample of a bodily fluid drawn from a patient.

Still another object of the present invention is to apply NMR spectroscopy in a manner which achieves the foregoing objectives.

These and other objects and features of the present invention will become apparent to those skilled in the art from a reading of the description of the invention which follows.

The invention proceeds from the realization that the components of the NMR spectrum which have significant predictive value may be masked by other materials in the sample. By eliminating the masking, as by eliminating the water signal, the previously masked spectrum of these components is revealed.

In accordance with the invention, a sample of a patient's bodily fluid is subjected to nuclear magnetic resonance spectroscopy to generate a nuclear magnetic resonance spectrum. A resonance line generated by a non-water component of the sample is selected, and the full width of this resonance line, e.g., at half its height, is measured. The full width so measured has proved to be a statistically reliable measure of the presence or absence of cancer in the patient.

In a preferred embodiment, there is provided a means for storing a predetermined value or range of values which are associated with individuals in which cancer is absent. There is also provided a means for comparing the measured linewidth with the value or range of values so stored.

In preferred embodiments, the bodily fluid is blood, spinal fluid, or bone marrow plasma; blood is especially advantageous. The component of interest is lipidic, and is preferably from the methyl and methylene groups of the lipoprotein lipids; and the water signal is suppressed to make the resonance lines of the components of interest more pronounced.

DESCRIPTION OF THE PREFERRED EMBODIMENTS

The water suppressed proton NMR spectrum obtained on human blood plasma is dominated by the resonances of the plasma lipoprotein lipids. Without water suppression, these non-water resonances are virtually overwhelmed by the water. Signal averaging allows observation of resonances of some moieties associated with non-water bodily fluid components, at high magnetic fields, even in the presence of the water resonance. However, the capability of modern NMR spectrometers to suppress nearly completely the water proton resonance facilitates practice of the present invention. The water suppressed proton NMR spectrum of plasma is essentially that of plasma lipoproteins and a few low molecular weight molecules. The protons of the proteins of plasma are obscured because they comprise a broad smear of unresolved resonances. The sharper resonances of the more mobile lipoprotein protons are superimposed on this broad background.

Figure 1:
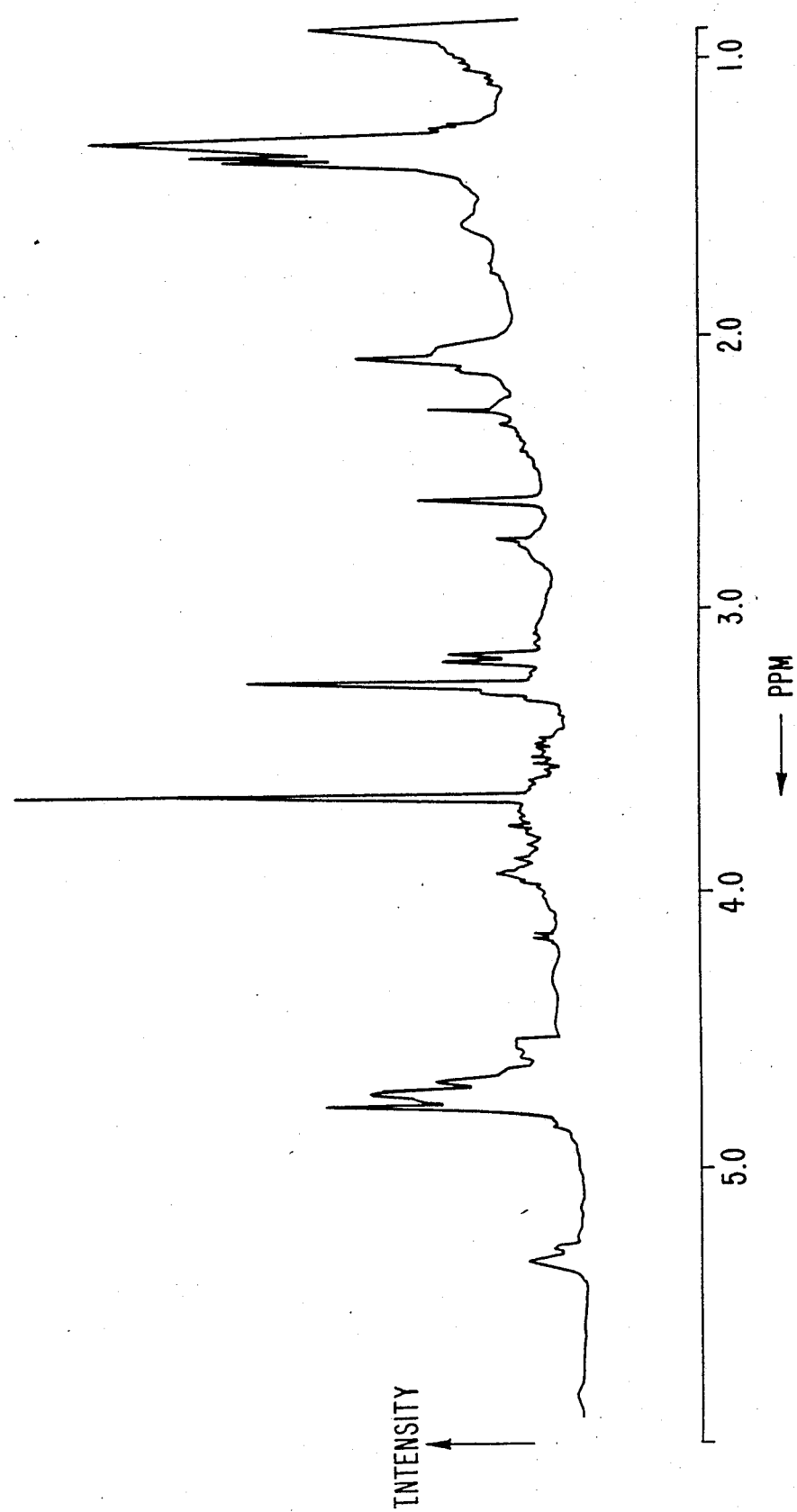
FIG. 1 is a typical NMR spectrum for the non-water components of a plasma sample from a healthy control centered on 360 MHz, obtained in accordance with the present invention.
Figure 2:
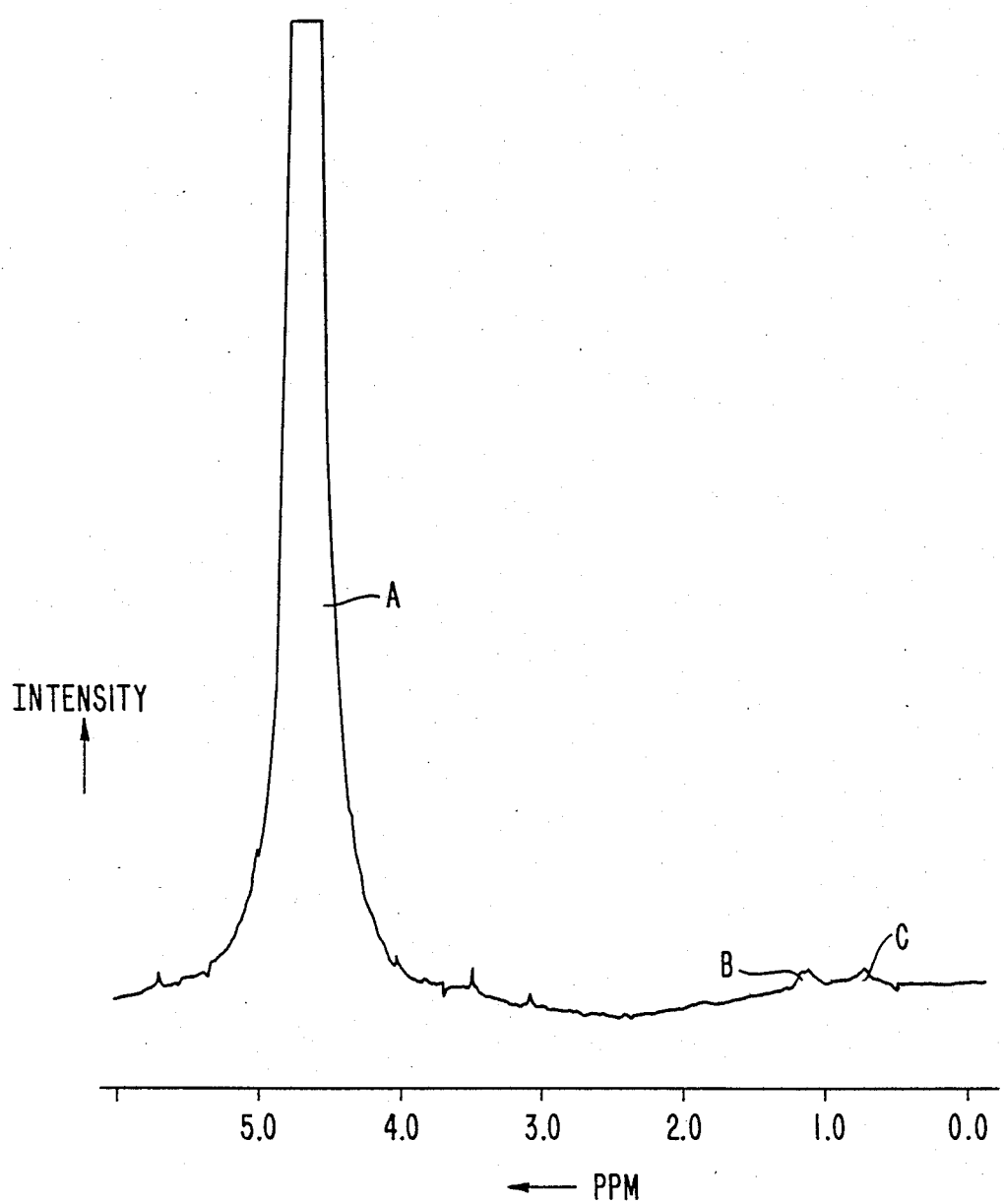
FIG. 2 i an NMR spectrum for the same plasma sample from which the spectrum of FIG. 1 was obtained, using the same equipment and pulse frequency, except without water suppression.
Figure 4:
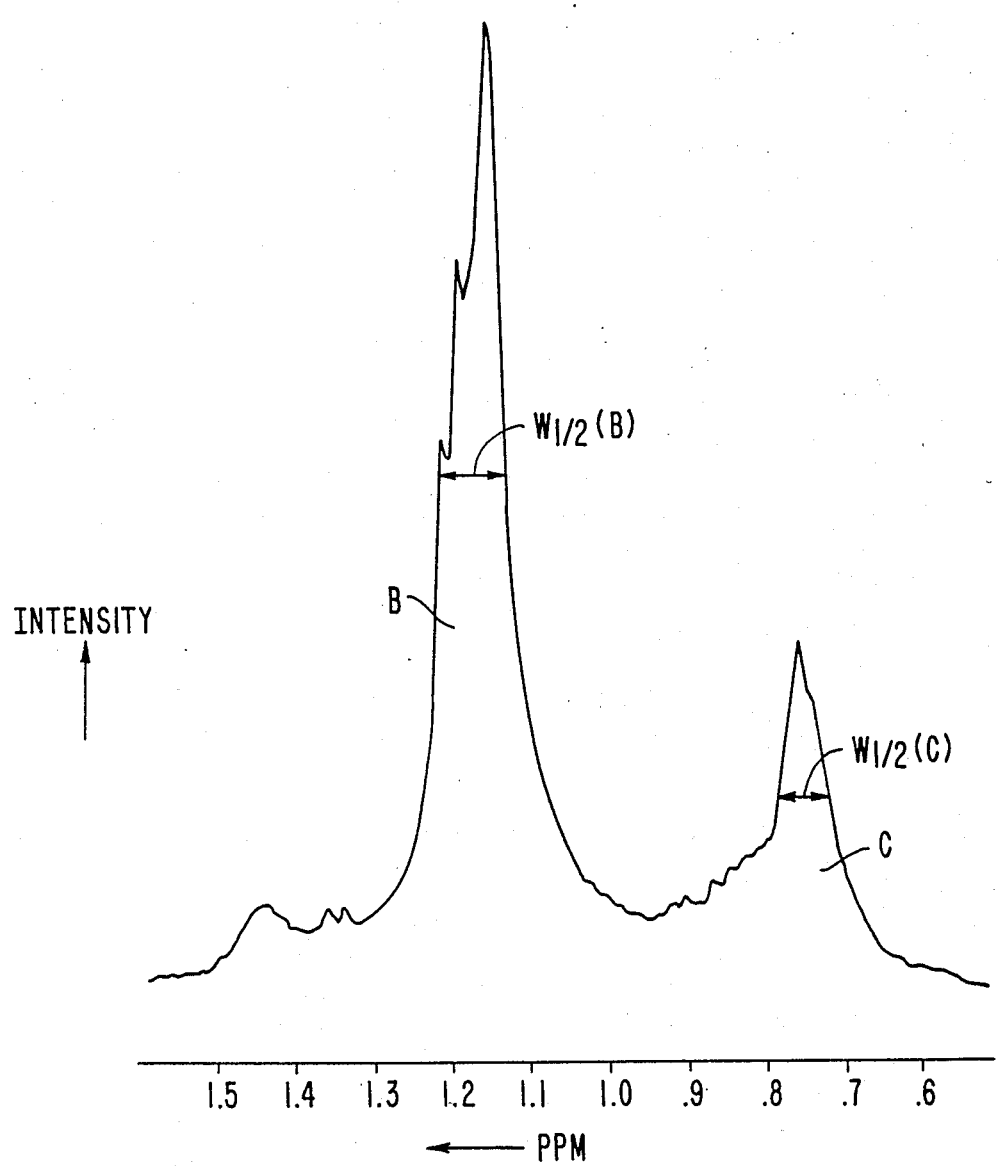
FIG. 4 is similar to FIG. 3 but for a patient with an untreated malignancy.
Figure 3:
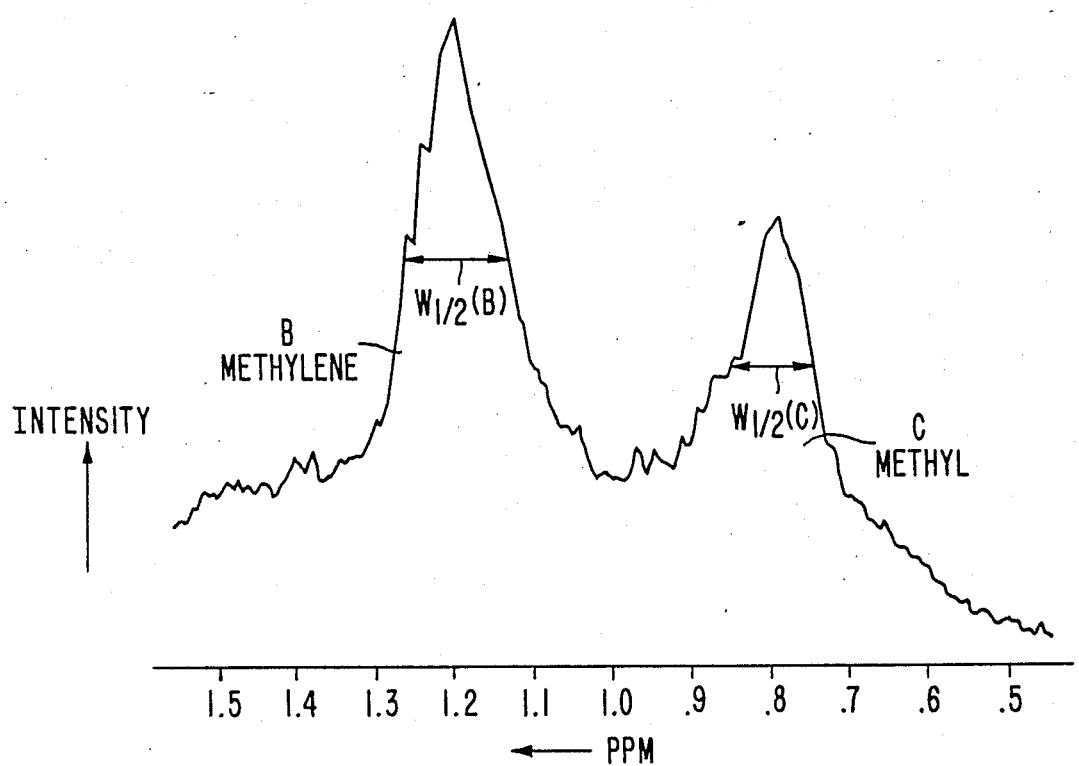
FIG. 3 is an expanded view of the methyl and methylene region of FIG. 1.

FIG. 1 shows a water suppressed proton spectrum of a healthy control, and FIG. 2 shows a proton spectrum of the same sample without water suppression. The truncated resonance line of water is denoted A in FIG. 2. The resonance lines between 2 and 3 ppm (parts per million of resonance frequency) arise from the methyl and methylene groups of the lipoprotein lipids. An expanded view of this region of the proton spectrum is shown in FIG. 3 for a normal control and in FIG. 4 for a patient with untreated malignancy. Accordingly, in its preferred embodiments the present invention uses one of a number of conventional water suppression techniques, i.e., techniques for suppression of the water proton NMR signal. Numerous techniques have been devised to suppress the water proton NMR signal in other contexts. These may be broadly divided into two categories: (1) those that aim not to excite the water proton signal, e.g., rapid scan correlation spectroscopy and the selective excitation technique, and (2) those that arrange for the water proton magnetization to be extremely small at the time the observe radiofrequency (rf) pulse is applied, e.g., the inversion recovery technique and saturation. These and other solvent suppression techniques are described by P. J. Hore in "Solvent Suppression in Fourier Transform Nuclear Magnetic Resonance," *Journal of Magnetic Resonance* 55,283–300 (1983) and the reference footnoted therein. The preference for use of a water suppression technique in the present invention is dictated by limitations of the apparatus in distinguishing between the signal of the solvent protons and those of the moiety or species of interest. Accordingly, a sufficiently sensitive apparatus would eliminate the need for water suppression.

In a preferred embodiment of the present invention the linewidth at half-height of the resonance of moieties, e.g., methyl and methylene groups, associated with the lipids of plasma lipoproteins are treated as the variable of interest. Full width at half-weight $W_{\frac{1}{2}}$ (linewidth) of an NMR resonance line is inversely proportional to the apparent spin-spin relaxation time ($T_2^*$), i.e.

$$W_{\frac{1}{2}} = \frac{1}{\pi T_2^*}.$$

The process of the present invention operates on any lipid-containing bodily fluid, e.g., blood, spinal fluid or bone marrow plasma. Whole blood, serum or plasma may be used. While the test may be performed on any such lipid-containing body fluid, work to date has focused on whole blood, blood serum and blood plasma. In blood the lipids, inclusive of cholesterol, triglycerides and phospholipids, are present in the form of lipoproteins. The test for cancer will typically be performed in vitro, preferably on serum or plasma.

The selected fluid of a suspect patient or other person to be screened for cancer is exposed to a magnetic field and radio-frequency energy to generate a nuclear magnetic resonance signal which is then processed to obtain a value for the selected parameter, e.g., $W_{\frac{1}{2}}$, for lipid methyl and/or methylene protons. A relatively broad range of proton frequencies may be employed, e.g., 60 MHz and higher, preferably 200–400 MHz.

The detected value for the selected parameter is then compared with the corresponding parameter for the healthy controls. In a preferred embodiment, values for methyl and methylene are averaged and an average value of 33 Hz or less (at a proton frequency of 360 MHz (8.45T) or 400 MHz (9.40T) is taken as an indication of malignancy.

Any conventional modern NMR spectrometer may be used in the practice of the present invention. In the preferred embodiments, an NMR spectrometer with a magnet at constant field strength is used and the NMR signal is Fourier transformed, with the full linewidth at half-height for proton resonances of methyl and methylene groups being the NMR parameter of interest.

The present invention provides statistically and clinically significant differences in plasma lipoprotein lipid linewidth measurements as between patients with untreated malignancies, patients undergoing treatment for malignancies, patients with benign tumors, pregnant women and control groups.

The example which follows serves to further illustrate a preferred embodiment of the present invention.

EXAMPLE

Blood samples were obtained from 215 individuals. Six patients were deleted because sufficient records were unobtainable. Data are reported for the remaining 209. In addition to plasma NMR measurements, HDL cholesterol levels were measured for most of the samples. Normal control samples were obtained from apparently healthy hospital personnel. Patients were selected from both the inpatient and outpatient populations. Patients with untreated malignancies, benign tumors, and surgically correctable conditions were selected blindly on several occasions by retrieving the blood samples of all preoperative patients for a given day. Patients with non-malignant illnesses were also studied in order to determine effects of certain disorders on the NMR measurements. Patients were particularly sought who had conditions with high cell turnover (ulcerative colitis, psoriasis, pregnancy), metabolic derangements (renal failure, hepatic failure, hyperthryroidism, diabetes) or cachexia and overwhelming illness. The patients were classified into six groups as shown in Table 1 on the basis of a detailed review of each patient's chart with respect to clinical and pathological diagnosis, extent of disease as evidenced by clinical, radiological, and laboratory measurements, and therapetutic interventions.

Blood was collected into Vacutainer tubes containing EDTA. In some cases citrated samples were also obtained for comparison with EDTA samples. Heparin or any other anticoagulent could likewise have been used to stop the blood from coagulating to a non-liquid form. Each sample was then centrifuged to separate out the red cells and the supernatant plasma was removed and used for NMR analysis.

Proton NMR spectra were obtained at radiofrequency pulses at either 360 MHz or 400 MHz using Bruker AM Pulsed Fourier transform spectrometers and a 5 mM OD proton probe. All samples were prepared in 5 mm OD tubes with, in most cases, a minimum of 0.4 ml plasma. Water suppression was accomplished by presaturation, applying discrete radiofrequency power at the position of the water resonance for six seconds prior to the 90° observation pulse. Sixteen free-induction decays were signal averaged and the resulting free induction decay was Fourier transformed resulting in a spectrum such as that shown in FIG. 1. An expanded version of the aliphatic region (0–2 ppm) was plotted and the full width at half-height $W_{\frac{1}{2}}$ of the methyl (line C) and methylene (line B) resonances was measured. The average of these two values $W_{\frac{1}{2}}(B)$ and $W_{\frac{1}{2}}(C)$, in Hertz, was used as the indicative parameter. No perceptable difference was noted between 8.45T (360 MHz) and 9.40T (400 MHz). In order to analyze these results in comparison with previous methods, $T_1$ values of samples with sufficient plasma volume (0.8 ml) were determined in an IBM mini-spec model PC-20 NMR spectrometer using the standard inversion recovery pulse sequence. The composite proton signal is observed at 20 MHz. The data thus obtained for each of the six groups of patients is summarized in Table 1 on the next page:

TABLE 1

| Designation | I Control | II Malignant Tumor | III Non-tumor Disease | IV - Bening Tumor Breast/Ovary/Uterus | Endocrine | Prostate | V Pregnancy | VI Malignant Tumor Treated |
|---|---|---|---|---|---|---|---|---|
| Number | 40 | 64[a] | 46 | 8 | 5 | 10 | 12 | 29[b] |
| Male | 15 | 29 | 28 | 0 | 2 | 10 | 0 | 14 |
| Female | 25 | 30 | 18 | 8 | 3 | 0 | 12 | 14 |
| Age Range | 22–58 | 24–90 | 20–91 | 32–46 | 23–85 | 58–80 | 20–37 | 16–86 |
| Linewidth | 40.1 ± 1.4 | 29.0 ± 2.7 | 36.9 ± 2.2 | 38.9 ± 1.6 | 33.4 ± 3.5 | 32.2 ± 3.2 | 31.0 ± 3.4 | 33.2 ± 3.9[c] |
| $T_1$ | 1.91 ± 0.18 | 1.98 ± 0.21 | 1.94 ± 0.14 | | | | | |
| HDL Cholesterol | 50 ± 14 | 38 ± 18 | 43 ± 28 | | | | | |

[a]One patient was tested before treatment and with progressive disease after treatment.
[b]Four patients were also tested before treated.
[c]See text for further evaluation.
NOTE: There were a total of 214 patients ranging in age from 20 to 91 years.

In experiments, linewidth measurements would detect changes as small as one Hertz. The reproducibility of the measurement expressed as differences in multiple determinations on the same sample was also one Hertz.

The tumor type or disease type, together with the linewidth range, for each type are given in tables 2–5 below.

TABLE 2

Tumor distribution and linewidth range for patients in Group II.

| Primary Tumor | Number | Linewidth Range |
|---|---|---|
| Breast | 12 | 28.0–32.5 |
| Gastrointestinal (colon, gastric, pancreatic ca) | 8 | 23.0–33.5 |
| Lymphomas (diffuse histiocytic, nodular poorly differentiated) | 6 | 27.5–32.5 |
| Leukemias (CLL, AMMOL, AML, CML) | 9 | 25.5–31.0 |
| Genitourinary (prostate, bladder, testicular, renal cell, ovarian, endometrial, teratocarcinoma) | 12 | 22.0–33.0 |
| Lung (adenocarcinoma, squamous cell ca, oat cell) | 6 | 24.5—31.5 |
| Central Nervous System (neural sarcoma, meningioma, glioblastoma) | 5 | 27.5–33.0 |
| Head & Neck | 2 | 31.0, 31.5 |
| Miscellaneous (melanoma, thymoma, mesothelioma, Ewing sarcoma) | 4 | 23.0–31.5 |

TABLE 3

Tumor burden and linewidth range for patients in Group II.

| Tumor Burden | Number | Linewidth Range |
|---|---|---|
| Localized | 21 | 23.0–33.0 |

TABLE 3-continued

Tumor burden and linewidth range for patients in Group II.

| Tumor Burden | Number | Linewidth Range |
| --- | --- | --- |
| Locally invasive | 14 | 22.0–31.5 |
| Metastatic | 20 | 24.0–33.5 |
| Systemic (leukmias) | 9 | 25.5–31.0 |

TABLE 4

Disease distribution and linewidth range for patients in Group III.

| Disease | Number | Linewidth Range |
| --- | --- | --- |
| Cardiovascular | 6 | 35.5–38.5 |
| Pulmonary | 2 | 39.0, 41.5 |
| Orthopedic | 4 | 36.5–41.5 |
| Gastrointestinal | 7 | 34.5–40.0 |
| Sepsis | 4 | 34.5–37.0 |
| Endocrine | 3 | 35.0–37.5 |
| Renal | 3 | 34.5–37.0 |
| CNS | 3 | 34.0–39.5 |
| Hematological | 4 | 36.0–40.5 |
| Genitourinary | 5 | 34.0–43.0 |
| Miscellaneous | 5 | 33.0–40.0 |

TABLE 5

Tumor distribution and linewidth range for patients in Group VI.

| Primary Tumor | Number | Linewidth Range |
| --- | --- | --- |
| Breast | 7 | 28.5–38.5 |
| Gastrointestinal | 1 | 30 |
| Lymphomas | 1 | 29.2 |
| Leukemias | 9 | 25–39 |
| Genitourinary | 4 | 28–41 |
| Lung | 2 | 31, 33 |
| CNS | 1 | 34.5 |
| Head & Neck | 1 | 34.5 |
| Endocrine | 1 | 33.5 |
| Miscellaneous | 1 | 39.5 |

The experimental data (Tables 1–5) shows a significant difference between Group I and Group II ($p<0.0001$). This data demonstrates that lipoprotein lipid linewidth discriminates between patients with uncontrolled proliferative disease and normal controls. This result is in contrast to various measurements which have been reported in the prior art in connection with attempts to differentiate patients with malignancies. Two of such prior art methods are plasma high density lipoprotein (HDL) cholesterol levels and the NMR spinlattice relaxation parameter $T_1$ for the total proton spectrum of plasma. Table 1 shows that there was a small increase in the mean $T_1$ for Group II, but there was significant overlap between this group and the control group. $T_1$ values for 69% of the patients were within 1 standard deviation of the normal mean value, and 96% were within 2 standard deviations. Consequently, measurement of total plasma proton $T_1$ was not found to be diagnostic of malignancy. Similarly, although mean HDL cholesterol decreased in Group II, the overlap with the control group was sufficiently large so as to be nondiagnostic.

There was a small decrease in mean lipoprotein linewidth for patients with benign tumors (Group IV) and patients with diseases other than malignancies (Group III), as compared to Group I ($0.05>p>0.02$). Groups III and IV are both clearly different from Group II ($p<0.0001$). There was, however, marked overlap between pregnant women (Group V) and Group II ($p>0.05$). Group VI was clinically the most heterogeneous and also had the largest range of linewidth values.

Linewidth measurements were found to be diagnostic of malignant disease but not of tumor type or tumor burden (Table 2).

Patients in Group IV all had benign tumors confirmed by biopsy reports. The mean linewidth of samples from these patients, which were obtained shortly before biopsy was lower than the mean value for normal healthy adults. Comparison of patients in Groups II and IV, paired for benign and malignant tumors, indicates that linewidth measurements are discriminative between the two groups (Table 3) ($p<0.0001$). One elderly patient with benign prostatic hypertrophy was the only exception, which raises the possibility of a small, undetected focus of malignancy in this patient.

Group IV patients were selected for non-tumor diseases and included a wide spectrum of disorders (Table 4). This population ranged from moderately to severely ill, with emphasis on the severely ill. This group was specifically designed to include elderly patients and patients with poor nutritional status, acute infection, renal failure, endocrine abnormalities, or proliferative, non-tumor disorders (e.g., polycythemia, ulcerative colitis, psoriasis). The objective in selecting these patients was to determine if severe illness per se, in the absence of clinically or pathologically evident malignancy, would result in linewidth measurements which were the same as those of the patients with malignancies. The results indicate that severe illness or proliferative disease alone does not produce change in lipoprotein linewidth comparable to that of malignancy. However, it was observed that the mean linewidth value for this group was lower than for the control group ($0.05>p>0.02$). Eighteen of the 46 patients, including some patients with acute myocardial infarction, ulceration colitis, polycythemia vera, and myelofibrosis, had values within two standard deviations of the normal mean, with the remainder falling slightly below. However, only one patient in this group (linewidth=33 Hz) overlapped with the malignant patients in Group II. This was a male, age 28, with an umbilical hernia.

A small cohort of pregnant women was also studied (Group V). The rationale for selecting these patients was that if the change observed in malignancies was reflective of rapid, proliferative growth, then pregnant women should have values intermediate between benign and malignant tumor patients. The results indicated that this hypothesis is correct. Samples were obtained from five women at term, from two at the beginning of the third trimester, from there in the second trimester, and from two in the first trimester. As with the tumor patients, a single sample did not reflect fetal size but did indicate proliferative activity.

Group VI constitutes a heterogeneous assortment of tumor patients undergoing or having recently completed treatment (<6 months), for whom it was too early to determine their response to therapy. This group also had the greatest range of linewidth measurements, as would be expected (Table 5), although the results suggest that changes in lipoprotein linewidth in an individual tumor patient during therapy reflect the effect of treatment in the patient. Thus, a series of measurements can reflect the response of the patient to therapy.

Figure 5:
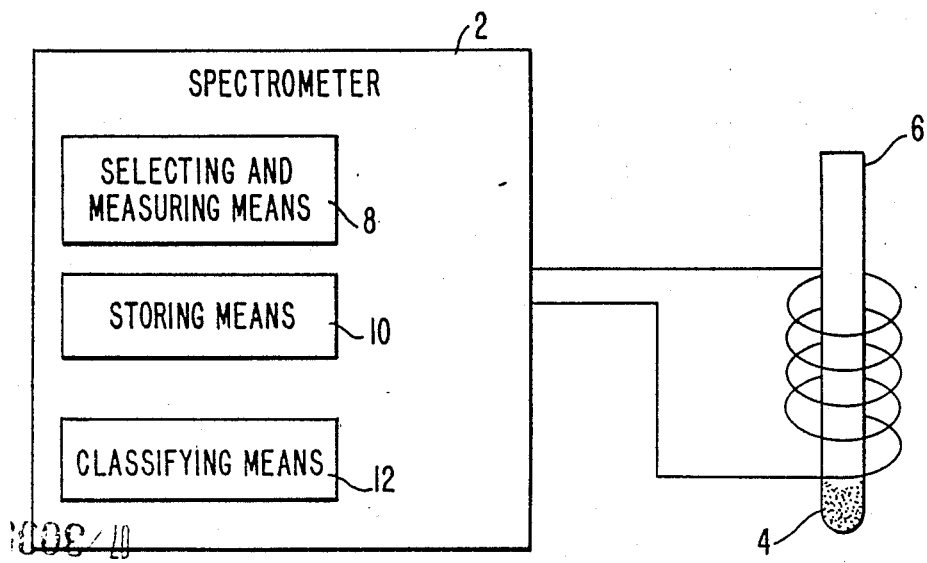
FIG. 5 schematically illustrates apparatus in accordance with the invention.

Referring now to FIG. 5, there is illustrated a nuclear magnetic resonance (NMR) spectrometer 2 which in the preferred embodiment is capable of performing proton NMR spectroscopy and which is preferably but not necessarily of the type that suppresses the NMR signal of water. The spectrometer 2 is adapted for examination of a sample 4, which in this example is human blood plasma contained within a test tube 6.

In accordance with the invention, the spectrometer 2 contains means 8 for selecting at least one and preferably a plurality such as two NMR resonance lines in the NMR spectrum of the sample 4 and measuring the linewidth of the line or lines so selected. Preferably, the linewidth is measured at half the height of the line, but this is not necessary and linewidth can be measured at any predetermined fraction of the height of the line in question. Measurement at half of line height is preferred because this is a standard measurement carried out in the field of NMR spectroscopy.

The spectrometer 2 is of conventional construction and includes in addition to all its other structure a means 10 for storing a value or range of values. In the preferred embodiment, a linewidth which is either measured directly or derived from a plurality of such direct measurements is compared with a value or range of values which represents the value or range of values to be expected from normal patients, i.e. patients who are free of cancer. In accordance with the invention, the spectrometer 2 also includes means 12 for classifying the measured or derived linewidths as normal (i.e. cancer-free) or abnormal (i.e. cancerous) based upon the stored information. This may be done by comparison, subtraction, or any other appropriate mathematical operation.

In the preferred embodiment, the selecting and measuring means 8 is preadjusted to measure the linewidths of the methyl and methylene groups of the lipoprotein lipids. This may be done by suppressing the signal of water from the NMR spectrum of the sample 4, or may alternatively be done directly where the spectrometer 2 is sensitive enough to do so.

In the preferred embodiment, the linewidths of the methyl and methylene groups are averaged to produce a composite linewidth which is the mathematical mean of the two. This composite linewidth is preferably then compared with 33 Hz, the value which is preferably stored in the means 10. The actual comparison is carried out by the classifying means 12. Where the comparison indicates that the composite linewidth is less than 33 Hz, this indicates an abnormal (i.e. cancerous) sample 4.

The invention may be embodied in other specified forms without departing from the spirit or essential characteristics thereof. The present embodiments are therefore to be considered in all respects as illustrative and not restrictive, the scope of the invention being indicated by the appended claims rather than by the foregoing description, and all changes which come within the meaning and range of equivalency of the claims are therefore intended to be embraced therein.

I claim:

1. A method of screening for the presence of cancer in a living patient, comprising the following steps:
   (a) subjecting a blood component sample from the patient to nuclear magnetic resonance spectroscopy to generate an NMR spectrum from which undesirable signals have been suppressed;
   (b) selecting an NMR resonance line in said spectrum;
   (c) measuring the full width at half-height of said line; and (d) classifying the full width so measured into a category of normal full widths or into a category of abnormal full widths.

2. A method of screening patients who do not have cancer from those who might have cancer, comprising the following steps:
   (a) subjecting a blood component sample from a patient to be tested to nuclear magnetic resonance spectroscopy to generate an NMR spectrum from which undesirable signals have been suppressed;
   (b) selecting a lipoprotein resonance line for lipid peaks in said spectrum;
   (c) measuring the full width at half-height of said resonance line and;
   (d) classifying the full width measured into either a category of normal full widths or into a category of abnormal full widths as compared to a predetermined standard for which abnormal full widths indicate the possibility of cancer.

3. The method of claim 2, wherein the nuclear magnetic resonance spectroscopy is of the proton type.

4. The method of claim 3, wherein the proton resonance is within the range of 200–400 MHz.

5. The method of claim 3, wherein the proton resonance is 360 MHz or greater.

6. The method of claim 2, wherein said subjecting step comprises suppressing the water signal.

7. The method of claim 2, wherein said subjecting step comprises obtaining a blood sample from the patient, removing red cells therefrom, and subjecting the plasma in the blood sample to nuclear magnetic resonance spectroscopy.

8. A method of screening patients who do not have cancer from those who might have caner, comprising the following steps:
   (a) subjecting a blood component sample from a patient to be tested to nuclear magnetic resonance spectroscopy to generate an NMR spectrum from which undesirable signals have been suppressed;
   (b) selecting a plurality of lipoprotein resonance lines from lipid peaks in said spectrum;
   (c) measuring the full width at half-height of said resonance lines;
   (d) deriving from all full widths so measured a composite line width; and
   (e) classifying the composite line width derived into either a category of normal composite line widths or into a category of abnormal composite line widths as compared to a predetermined standard for which abnormal composite line widths indicate the possibility of cancer.

9. The method of claim 8, wherein said deriving step comprises the step of computing the mathematical mean.

10. The method of claim 8, wherein said plurality is two.

11. A method of screening patients who do not have cancer from those who might have cancer, comprising the following steps:
   (a) subjecting a lipid-containing bodily fluid sample from the patient to be tested to nuclear magnetic resonance spectroscopy to generate an NMR spectrum;
   (b) selecting an NMR resonance line in said spectrum from a non-water component of said sample;
   (c) measuring the full width so measured at half-height of said line;
   (d) classifying the full width derived into either a category of normal full widths or into a category of abnormal full widths as compared to a predetermined standard for which abnormal full widths indicate the possibility of cancer.

12. The method of claim 11, wherein the non-water component is a lipid.

13. The method of claim 12, wherein the sample is blood plasma, spinal fluid or bone marrow plasma, and wherein said selected resonance line is selected from a class containing the methyl group of the lipoprotein lipids and the methylene group of the lipoprotein lipids.

14. A method of screening patients who do not have cancer from those who might have cancer, comprising the following steps:
   (a) subjecting a lipid-containing bodily fluid sample from a patient to be tested to nuclear magnetic resonance spectroscopy to generate an NMR spectrum;
   (b) selecting a plurality of NMR resonance lines in said spectrum from a non-water component of said sample;
   (c) measuring the full width at half-height of said resonance lines;
   (d) deriving from all full widths so measured a composite linewidth; and
   (e) classifying the composite line width derived into either a category of normal composite line widths or into category of abnormal composite line widths as compared to a predetermined standard for which abnormal composite line widths indicate the possibility of cancer.

15. A method of screening patients who do not have cancer from those who might have cancer, comprising the following steps:
   (a) subjecting a blood plasma, bone marrow plasma or spinal fluid to proton nuclear magnetic resonance spectroscopy to generate an NMR spectrum from which the water signal has been suppressed;
   (b) selecting the resonance lines of the methyl and methylene groups of the lipoproteins in said spectrum;
   (c) measuring the full width at half-height of each of said resonance lines;
   (d) computing the average width from the full widths so measured;
   (e) classifying the average width computed into either a category of normal average widths or into a category of abnormal average widths as compared to a predetermined standard for which abnormal average widths indicate the possibility of cancer.

16. A method for screening patients who do not have cancer from those who might have cancer comprising:
   (a) establishing a standard value for at least one NMR parameter for nuclei of at least one moiety associated with a constituent, other than water, of a lipid-containing bodily fluid of cancer-free subjects;
   (b) exposing the same type bodily fluid of a subject to be screened for cancer to a magnetic field and radio-frequency energy to generate a nuclear magnetic resonance spectrum;
   (c) processing the nuclear magnetic resonance spectrum to obtain a value for said at least one parameter of said at least one moiety nuclei of the fluid exposed;
   (d) comparing the standard value established for said at least one parameter with the value obtained for said fluid exposed; and
   (e) classifying the value so established for said fluid exposed into either a category of normal or into a category of abnormal as compared to a predetermined standard for which abnormal values indicate the possibility of cancer.

17. A method in accordance with claim 14 wherein said lipid-containing bodily fluid is blood, blood serum or blood plasma.

18. A method in accordance with claim 16, wherein a sample of said bodily fluid is removed from the subject to be diagnosed and steps b and c are conducted in vitro.

19. A method in accordance with claim 16 wherein said nuclei are protons and wherein said at least one moiety is selected from the group consisting of methyl and methylene.

20. A method in accordance with claim 19 wherein said methyl and methylene are associated with the lipids of plasma lipoprotein.

21. A method in accordance with claim 19 additionally comprising suppressing the NMR resonance signal of water.

22. A method in accordance with claim 16 wherein said at least one NMR parameter is an average value derived from the resonance lines of methyl and methylene protons.

23. A method in accordance with claim 22 wherein said at least one parameter is the average value of the full widths at half-height of the methyl and methylene proton resonances.

24. A method in accordance with claim 16 wherein said at least one parameter is the full width at half-height of the NMR resonance line of said at least one moiety nuclei.

25. A method in accordance with claim 24 additionally comprising suppressing the NMR resonance signal of water.

26. A method in accordance with claim 16 wherein said at least one parameter is the apparent spin-spin relaxation time $T_2^*$.

27. A method in accordance with claim 16 additionally comprising suppressing the NMR resonance signal of water.

* * * * *

UNITED STATES PATENT AND TRADEMARK OFFICE
CERTIFICATE OF CORRECTION

PATENT NO. : 4,912,050
DATED : March 27, 1990
INVENTOR(S) : Eric T. Fossel

It is certified that error appears in the above—identified patent and that said Letters Patent is hereby corrected as shown below:

Col. 4, line 56, delete "(9.40T)" and insert --(9.40T))--.
Cols. 5-6, Table 1, delete "IV - Bening Tumor" and insert
    --IV-Benign Tumor--.
Cols 5-6, Table 1, NOTE; delete "20 to 91 years" and
    insert --16 to 91 years--.
Col. 8, line 15, delete "Group IV" and insert --Group III--.

Signed and Sealed this

Twenty-second Day of October, 1991

Attest:

HARRY F. MANBECK, JR.

*Attesting Officer*  *Commissioner of Patents and Trademarks*